United States Patent
Wang et al.

(10) Patent No.: US 11,222,929 B2
(45) Date of Patent: Jan. 11, 2022

(54) DISPLAY PANEL AND DISPLAY DEVICE

(71) Applicant: Xiamen Tianma Micro-Electronics Co., Ltd., Xiamen (CN)

(72) Inventors: Hailiang Wang, Xiamen (CN); Yaying Li, Xiamen (CN); Yan Yang, Xiamen (CN); Ting Zhou, Xiamen (CN); Junyi Li, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/232,941

(22) Filed: Apr. 16, 2021

(65) Prior Publication Data

US 2021/0233970 A1 Jul. 29, 2021

(30) Foreign Application Priority Data

Dec. 25, 2020 (CN) .......................... 202011567076.4

(51) Int. Cl.
  *H01L 27/32* (2006.01)
  *G02F 1/1335* (2006.01)
  *G02F 1/13357* (2006.01)

(52) U.S. Cl.
  CPC .... *H01L 27/3218* (2013.01); *G02F 1/133514* (2013.01); *H01L 27/3213* (2013.01); *H01L 27/3216* (2013.01); *G02F 1/133602* (2013.01)

(58) Field of Classification Search
  CPC ........................................ H01L 27/3211–3218
  See application file for complete search history.

(56) References Cited

U.S. PATENT DOCUMENTS 10,777,113 B2 * 9/2020 Ikeda ................... G09G 3/3225
2017/0278903 A1 * 9/2017 Zhou ................... H01L 27/3211

FOREIGN PATENT DOCUMENTS

| CN | 110767158 A | | 2/2020 |
| CN | 110767712 A | | 2/2020 |
| CN | 111180483 A | * | 5/2020 |
| CN | 111402740 A | | 7/2020 |
| CN | 112151590 A | * | 12/2020 |
| KR | 20210111748 A | * | 9/2021 |

* cited by examiner

*Primary Examiner* — Mariceli Santiago
(74) *Attorney, Agent, or Firm* — von Briesen & Roper, s.c.

(57) ABSTRACT

Provided are a display panel and a display device. The display panel includes a first display region, a second display region, and a transition display region between the first display region and the second display region. The second display region includes second pixel units, the transition display region includes third pixel units, and each second pixel unit and each third pixel unit both include a first sub-pixel, a second sub-pixel, a third sub-pixel, and a white sub-pixel. A ratio of a total opening area of white sub-pixels in the second pixel units to a total area of the second pixel units is A, and a ratio of a total opening area of white sub-pixels in the third pixel units to a total area of the third pixel units is B, where B<A. The white sub-pixel is turned on or off in a display stage of the display panel.

20 Claims, 11 Drawing Sheets

DISPLAY PANEL AND DISPLAY DEVICE

CROSS-REFERENCE TO RELATED APPLICATION(S)

This application claims priority to Chinese Patent Application No. 202011567076.4 filed Dec. 25, 2020, the disclosure of which is incorporated herein by reference in its entirety.

TECHNICAL FIELD

Embodiments of the present disclosure relate to the field of display technology, and in particular, to a display panel and a display device.

BACKGROUND

With the continuous development of display technology, users have increasingly higher requirements for a screen ratio, so a scheme in which a camera is disposed below a display panel and a full screen can be achieved is favored by the users.

Currently, the display panel where the camera is disposed below the display panel includes a first display region and a second display region, the first display region is a normal display region, and the second display region is a camera reserved region. The camera is disposed on one side of the second display region facing away from a display surface of the display panel, and external light can pass through the second display region and be incident on the camera so as to ensure the normal function of the camera. On the other hand, the first display region and the second display region both include sub-pixels and can perform image display. However, in order to enable the camera to receive sufficient light, a sub-pixel density of the second display region is less than a sub-pixel density of the first display region so as to increase an area of a light transmitting region. Therefore, an apparent boundary exists between the first display region and the second display region which have larger brightness differences and pixel density differences from each other, thereby resulting in poor display effect of the display panel.

SUMMARY

The present disclosure provides a display panel and a display device so as to improve the display effect of the display panel.

In a first aspect, embodiments of the present disclosure provide a display panel. The display panel includes a first display region, a transition display region, and a second display region. The transition display region is disposed between the first display region and the second display region, and a pixel density of the second display region is less than a pixel density of the first display region.

The second display region includes a plurality of second pixel units, the transition display region includes a plurality of third pixel units, and each of the plurality of second pixel units and each of the plurality of third pixel units both include a first sub-pixel, a second sub-pixel, a third sub-pixel, and a white sub-pixel.

A ratio of a total opening area of white sub-pixels in the plurality of second pixel units to a total area of the plurality of second pixel units is A, and a ratio of a total opening area of white sub-pixels in the plurality of third pixel units to a total area of the plurality of third pixel units is B, where B<A.

The white sub-pixel is configured to be turned on or off in a display stage of the display panel.

In a second aspect, embodiments of the present disclosure further provide a display device including the display panel described in the first aspect and an optical electronic component disposed in a second display region.

The display panel provided by the embodiments of the present disclosure includes the first display region, the transition display region, and the second display region. The transition display region is disposed between the first display region and the second display region, and the pixel density of the second display region is less than the pixel density of the first display region. The second display region includes a plurality of second pixel units, the transition display region includes a plurality of third pixel units, and each of the plurality of second pixel units and each of the plurality of third pixel units both include the first sub-pixel, the second sub-pixel, the third sub-pixel, and the white sub-pixel. The ratio of the total opening area of white sub-pixels in the plurality of second pixel units to the total area of the plurality of second pixel units is A, and the ratio of the total opening area of white sub-pixels in the plurality of third pixel units to the total area of the plurality of third pixel units is B, where B<A. The white sub-pixel is turned on or off in the display stage of the display panel. In this way, the brightness and the fineness of the display image is gradually transitioned from the first display region to the second display region, avoiding the existence of apparent boundary between the first display region and the second display region, and improving the display effect of the display panel.

BRIEF DESCRIPTION OF DRAWINGS

Other features, objects and advantages of the present disclosure will become more apparent from a detailed description of non-restrictive embodiments with reference to the drawings.

DETAILED DESCRIPTION

Figure 1:
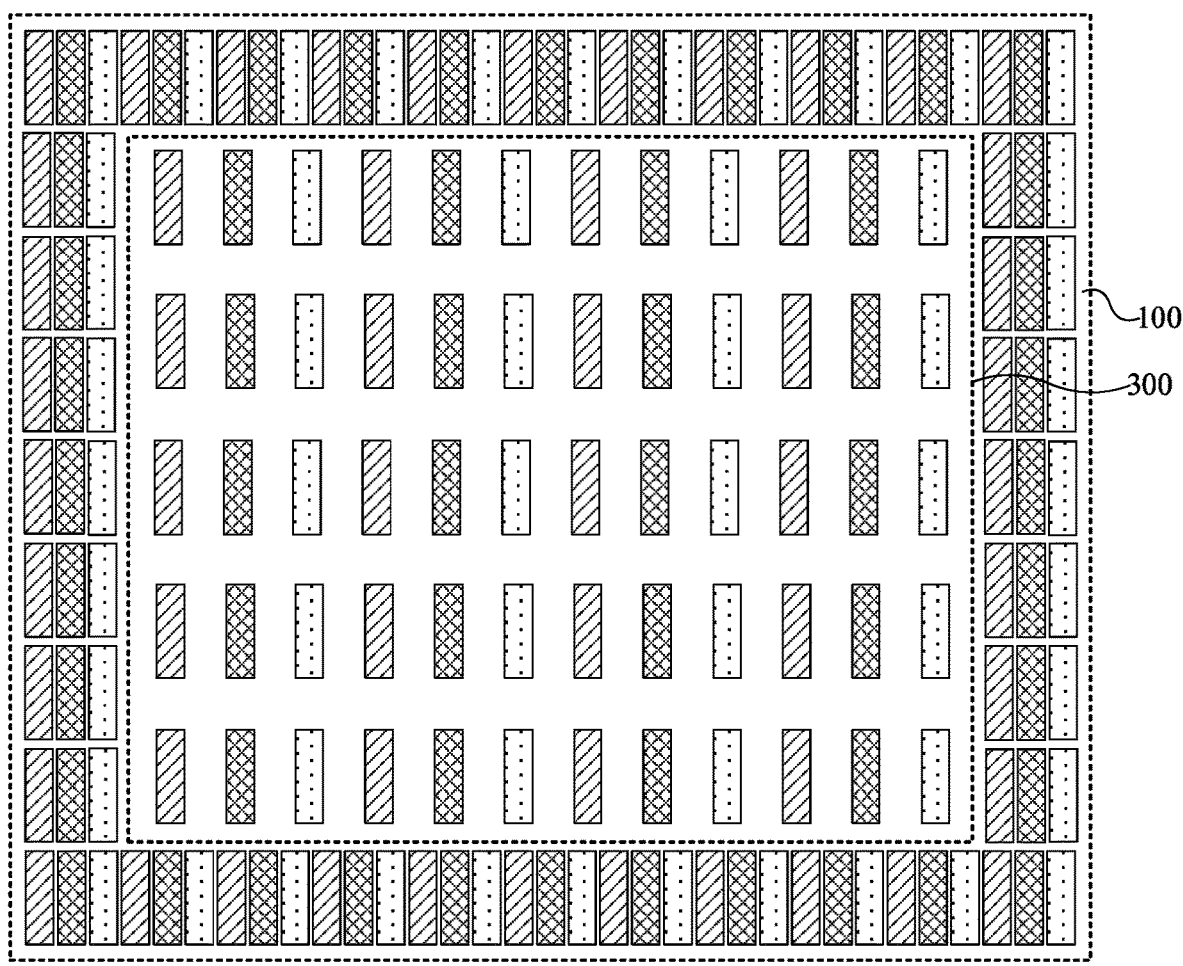
FIG. 1 is a partial structure diagram of a display panel in the related art.

To set forth technical means and technical effects for achieving an intended purpose of the present disclosure, embodiments, structures, features and effects of a display panel and a display device according to the present disclosure are described hereinafter in detail with reference to accompanying drawings and preferred embodiments.

Embodiments of the present disclosure provide a display panel. The display panel includes a first display region, a transition display region, and a second display region. The transition display region is disposed between the first display region and the second display region, and a pixel density of the second display region is less than a pixel density of the first display region.

The second display region includes a plurality of second pixel units, the transition display region includes a plurality of third pixel units, and each of the plurality of second pixel units and each of the plurality of third pixel units both include a first sub-pixel, a second sub-pixel, a third sub-pixel, and a white sub-pixel.

A ratio of a total opening area of white sub-pixels in the plurality of second pixel units to a total area of the plurality of second pixel units is A, and a ratio of a total opening area of white sub-pixels in the plurality of third pixel units to a total area of the plurality of third pixel units is B, where B<A.

The white sub-pixel is turned on or off in a display stage of the display panel.

The display panel provided by the embodiments of the present disclosure includes the first display region, the transition display region, and the second display region. The transition display region is disposed between the first display region and the second display region, and the pixel density of the second display region is less than the pixel density of the first display region. The second display region includes a plurality of second pixel units, the transition display region includes a plurality of third pixel units, and both each of the plurality of second pixel units and each of the plurality of third pixel units include the first sub-pixel, the second sub-pixel, the third sub-pixel, and the white sub-pixel. The ratio of the total opening area of white sub-pixels in the plurality of second pixel units to the total area of the plurality of second pixel units is A, and the ratio of the total opening area of white sub-pixels in the plurality of third pixel units to the total area of the plurality of third pixel units is B, where B<A. The white sub-pixel is turned on or off in the display stage of the display panel. In this way, the brightness and the fineness of the display image is gradually transitioned from the first display region to the second display region, avoiding the existence of apparent boundary between the first display region and the second display region, and improving the display effect of the display panel.

The above is a core idea of the present application, and solutions in embodiments of the present disclosure will be described clearly and completely in conjunction with the drawings in the embodiments of the present disclosure. Apparently, the embodiments described below are merely part, not all of the embodiments of the present disclosure. Based on the embodiments of the present disclosure, all other embodiments obtained by those skilled in the art without creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the spirit of the present disclosure. Therefore, the disclosure is not limited to the specific embodiments described below.

In addition, the present disclosure will be described in detail in conjunction with the drawings. In detailed description of embodiments of the present disclosure, for ease of description, schematic diagrams illustrating structures of devices and components are not partially enlarged in accordance with a general proportional scale. The schematic diagrams are merely illustrative and are not intended to limit the scope of the present disclosure. In addition, manufacturing includes three-dimension spatial sizes: length, width and height.

FIG. 1 is a partial structure diagram of a display panel in the related art. As shown in FIG. 1, the display panel includes a first display region 100 and a second display region 300, and the pixel density of the second display region 300 is less than the pixel density of the first display region 100. A region between two adjacent pixels in the second display region 300 serves as a light transmitting region, the light transmitting region is configured to provide a natural light incident channel such that the external natural light can be transmitted to an optical component below the second display region 300, thereby ensuring the normal working of the optical component. The brightness difference between the first display region 100 and the second display region 300 is relatively large due to the existence of the light transmitting region, such that the boundary between the first display region 100 and the second display region 300 is apparent, thereby affecting the display effect of the display panel.

In order to solve the above problems, embodiments of the present disclosure provide a display panel, a transition display region is disposed between the first display region and the second display region, and the pixel unit in the transition display region includes a white sub-pixel whose on-off is controllable. In this way, gradual transition of the color sub-pixel density from the first display region to the second display region is achieved, gradual transition of the fineness of the display image from the first display region to the second display region is achieved, and white sub-pixels can be used for brightness adjustment such that the gradual transition of brightness from the first display region to the second display region is ensured and the apparent boundary between the first display region and the second display region is eliminated, thereby improving the display effect of the display panel.

Figure 2:
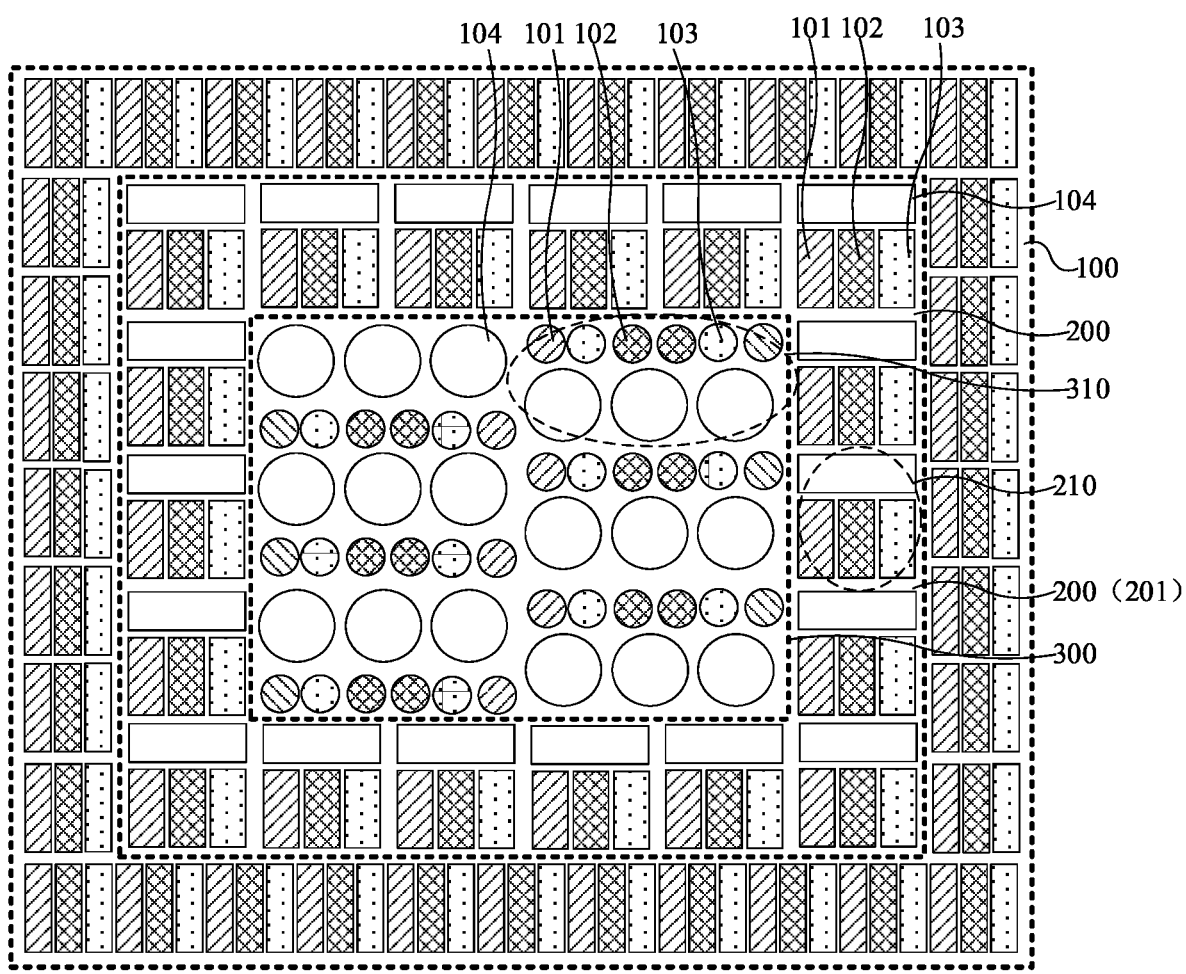
FIG. 2 is a partial structure diagram of a display panel according to an embodiment of the present disclosure.

In an embodiment, FIG. 2 is a partial structure diagram of a display panel according to an embodiment of the present disclosure. As shown in FIG. 2, the display panel includes a first display region 100, a transition display region 200, and a second display region 300. The transition display region 200 is disposed between the first display region 100 and the second display region 200, and a pixel density of the second display region 300 is less than a pixel density of the first display region 100.

The second display region 300 includes a plurality of second pixel units 310, the transition display region 200 includes a plurality of third pixel units 210, each of the plurality of second pixel units 310 includes a first sub-pixel 101, a second sub-pixel 102, a third sub-pixel 103, and a white sub-pixel 104, and each of the plurality of third pixel units 210 also includes a first sub-pixel 101, a second sub-pixel 102, a third sub-pixel 103, and a white sub-pixel 104.

A ratio of a total opening area of white sub-pixels 104 in the plurality of second pixel units 310 to a total area of the plurality of second pixel units 310 is A, and a ratio of a total opening area of white sub-pixels 104 in the plurality of third pixel units 210 to a total area of the plurality of third pixel units 210 is B, where B<A. The white sub-pixel 104 is turned on or off in a display stage of the display panel.

Exemplarily, light emitting colors of the first color sub-pixel 101, the second color sub-pixel 102, and the third color sub-pixel 103 may be any one of red, green, and blue, respectively, and the light emitting colors of the first color sub-pixel 101, the second color sub-pixel 102, and the third color sub-pixel 103 are different from each other such that full-color display of the display panel is achieved.

In this way, a ratio of a total opening area of color sub-pixels (the first color sub-pixel 101, the second color sub-pixel 102, and the third color sub-pixel 103) other than the white sub-pixel 104 in the second pixel unit 310 to a total area of the second pixel unit 310 is N, a ratio of a total opening area of color sub-pixels other than the white sub-pixel 104 in the third pixel unit 210 to a total area of the third pixel unit 210 is M, and an in equation that N<M is satisfied. In a case where the first display region 100 includes only color sub-pixels (the first sub-pixel 101, the second sub-pixel 102, and the third sub-pixel 103), a ratio of a total opening area of color sub-pixels (the first sub-pixel 101, the second sub-pixel 102, and the third sub-pixel 103) to the total area of the pixel unit of the first display region 100, a ratio of a total opening area of color sub-pixels (the first sub-pixel 101, the second sub-pixel 102, and the third sub-pixel 103) to the total area of the pixel unit of the transition display region 200, and a ratio of a total opening area of color sub-pixels (the first sub-pixel 101, the second sub-pixel 102, and the third sub-pixel 103) to the total area of the pixel unit of the second display region 300 sequentially decrease, such that the fineness of the display image is gradually transitioned and no apparent boundary exists between the display image of the first display region 100 and the display image of the second display region 300, thus facilitating the improvement of the display effect.

In addition, in the display stage, brightness of the first display region 100, brightness of the transition display region 200, and brightness of the second display region 300 sequentially decrease due to the influence of the difference of the pixel densities, while the total opening area of the white sub-pixels 104 in the first display region 100, the transition display region 200 and the second display region 300 sequentially increases, such that brightness compensation can be performed by turning on the white sub-pixels 104. In this way, brightness difference among the first display region 100, the transition display region 200 and the second display region 300 is reduced, no apparent boundary exists between the first display region 100 and the second display region 300, and the brightness uniformity of the display panel is better.

In a normal working stage of the optical component in the second display region 300, the white sub-pixel 104 may serve as a light transmitting region so as to provide an optical transmission path, such that the optical component can be ensured to receive sufficient light. Transmission of external light through the display panel also results in a significant difference in brightness between the first display region 100 and the second display region 300. The white sub-pixel 104 in the transition display region 200 has the same structure as the white sub-pixel 104 in the second display region 300, and both the white sub-pixels 104 in the transition display region 200 and the white sub-pixel 104 in the second display region 300 are light transmitting; and the total opening area of the white sub-pixels 104 in the transition display region 200 is less than the total opening area of the white sub-pixels 104 in the second display region 300. In this way, the brightness difference among the first display region 100, the transition display region 200 and the second display region 300 caused by the transmission of external light is gradually transitioned, the apparent boundary between the first display region 100 and the second display region 300 is eliminated, thereby improving the display effect of the display panel.

It is worth noting that a boundary between the first display region 100 and the transition display region 200 is a first boundary, a boundary between the transition display region 200 and the second display region 300 is a second boundary, and the first boundary and the second boundary each being a rectangle is only described as an example in FIG. 1, which is not limited herein. In other embodiments of this embodiment, the boundary between the first display region 100 and the transition display region 200 may further be U-shaped or other shapes.

The display panel provided by the embodiments of the present disclosure includes the first display region, the transition display region, and the second display region. The transition display region is disposed between the first display region and the second display region, and the pixel density of the second display region is less than the pixel density of the first display region. The second display region includes a plurality of second pixel units, the transition display region includes a plurality of third pixel units, and each of the plurality of second pixel units includes the first sub-pixel, the second sub-pixel, the third sub-pixel, and the white sub-pixel, and each of the plurality of third pixel units also includes the first sub-pixel, the second sub-pixel, the third sub-pixel, and the white sub-pixel. The ratio of the total opening area of white sub-pixels in the plurality of second pixel units to the total area of the plurality of second pixel units is A, and the ratio of the total opening area of white sub-pixels in the plurality of third pixel units to the total area of the plurality of third pixel units is B, where B<A. The white sub-pixel is turned on or off in the display stage of the display panel. In this way, the brightness and the fineness of the display image are gradually transitioned from the first display region to the second display region, avoiding the existence of apparent boundary between the first display region and the second display region, and improving the display effect of the display panel.

Referring to FIG. 2 the transition display region 200 includes a first sub-transition display region 201.

In this case, the third pixel units 210 in the transition display region 200 each have a single structure, and the plurality of third pixel units 210 can be simply and closely arranged, thereby facilitating reduction of the complexity for pixel arrangement of the transition display region 200.

Figure 3:
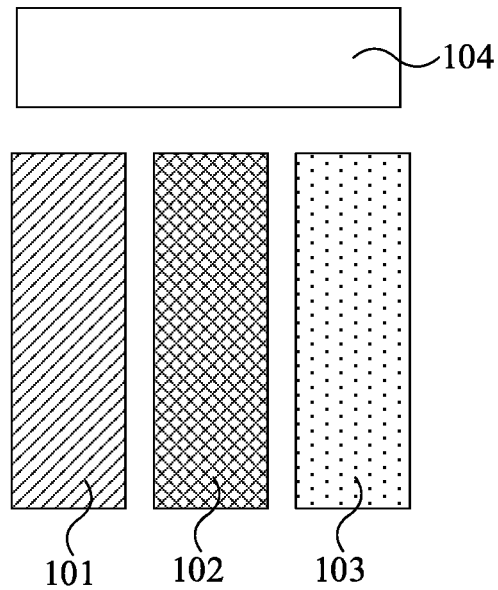
FIG. 3 is a structure diagram of a third pixel unit in a first sub-transition display region according to an embodiment of the present disclosure.

In an embodiment, FIG. 3 is a structure diagram of a third pixel unit in a first sub-transition display region according to an embodiment of the present disclosure. As shown in FIG. 3, the first sub-pixel 101, the second sub-pixel 102, the third sub-pixel 103, and the white sub-pixel 104 in the third pixel unit 210 in the first sub-transition display region each have a first shape, and the first shape may be, for example, a rectangle.

It is to be noted that the sub-pixel in the first display region is typically a rectangle, the first sub-transition display region is disposed adjacent to the first display region. The shape of the sub-pixel of the first sub-transition display region is similar to that of the first display region, and the opening area of the sub-pixel of the first sub-transition display region is similar to that of the first display region, thereby facilitating smooth transition of the display image and improving the quality of the display image.

Figure 4:
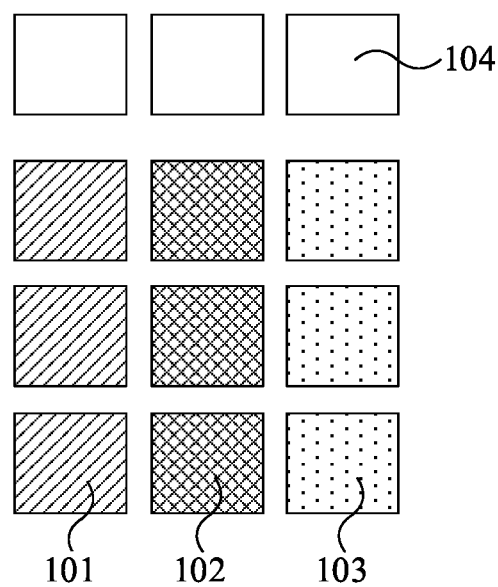
FIG. 4 is a structure diagram of a third pixel unit in a first sub-transition display region according to an embodiment of the present disclosure.
Figure 5:
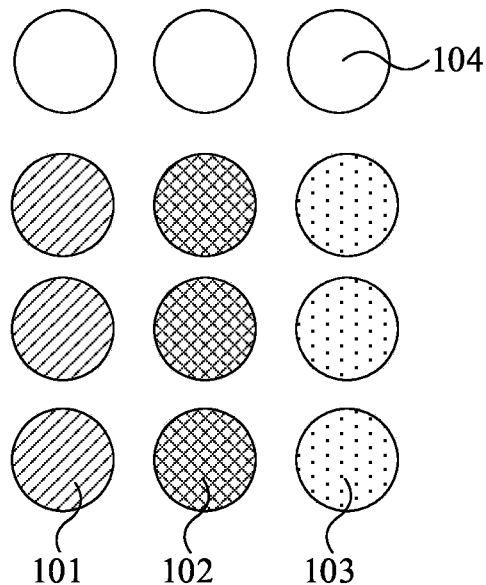
FIG. 5 is a structure diagram of a third pixel unit in a first sub-transition display region according to an embodiment of the present disclosure.
Figure 6:
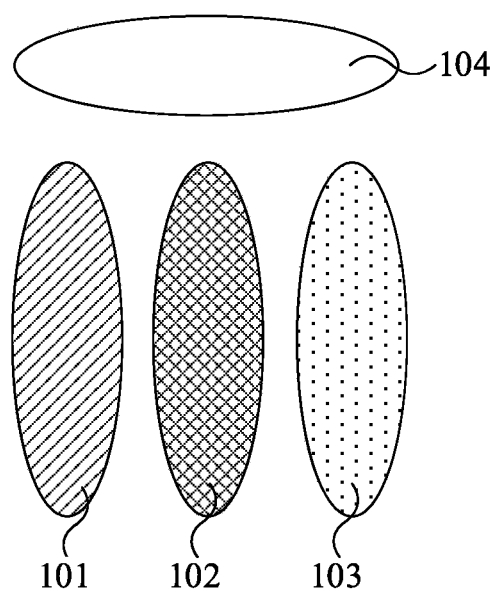
FIG. 6 is a structure diagram of a third pixel unit in a first sub-transition display region according to an embodiment of the present disclosure.

In other implementation modes of this embodiment, the first shape may further be other shapes. For example, the first shape may be a square as shown in FIG. 4, or the first shape may be a circle as shown in FIG. 5, or the first shape may be an oval as shown in FIG. 6. It is worth noting that any first shape that can achieve smoothly transition with the opening area of the sub-pixels in the first display region is within the scope of this embodiment.

Figure 7:
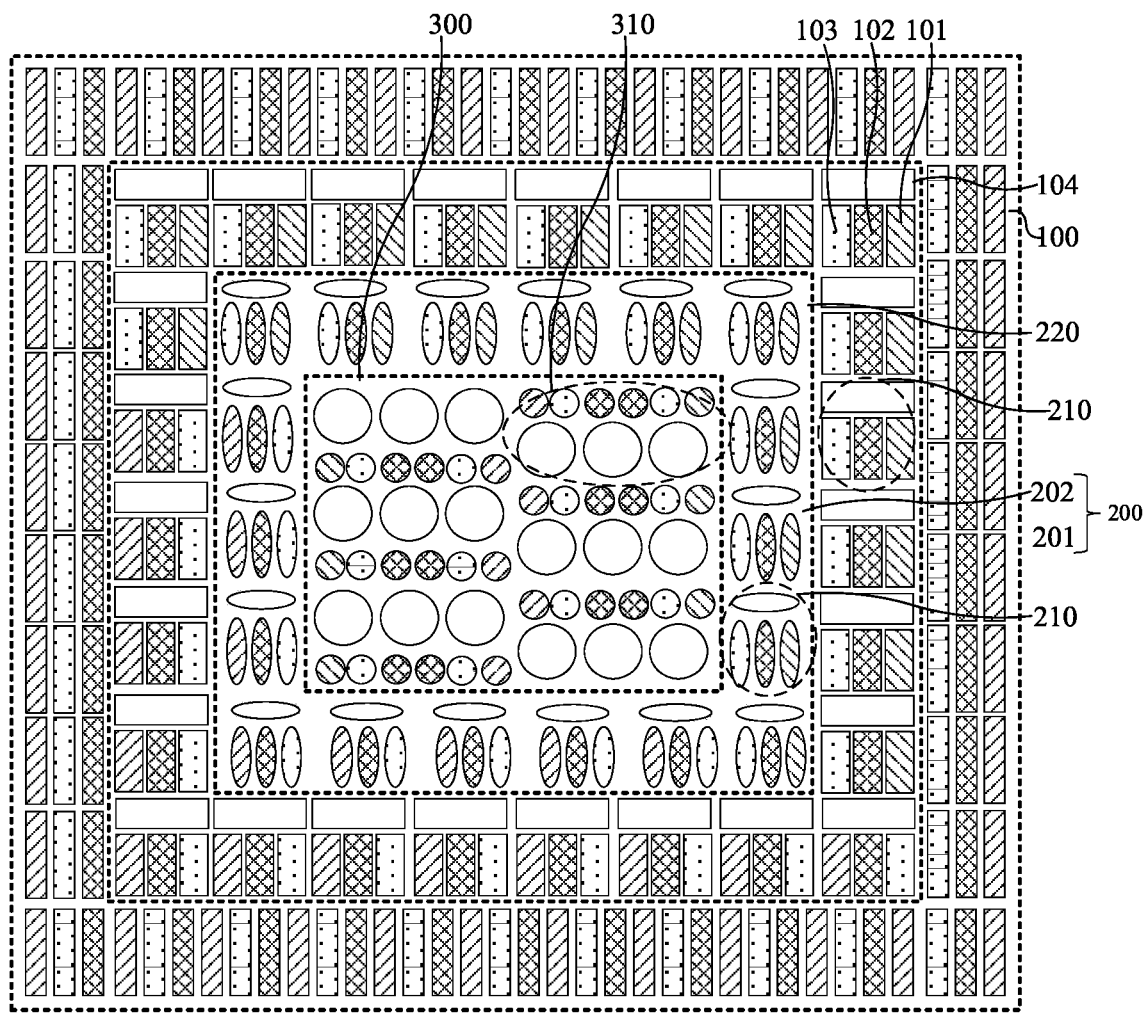
FIG. 7 is a partial structure view of another display panel according to an embodiment of the present disclosure.

FIG. 7 is a partial structure view of another display panel according to an embodiment of the present disclosure. As shown in FIG. 7, the transition display region 200 includes a first sub-transition display region 201 and a second sub-transition display region 202, and the second sub-transition display region 202 is disposed on one side of the first sub-transition display region 201 facing towards the second display region 300.

In this way, secondary transition may be formed in the transition display region 200, a gradient step is added, the image fineness difference and the brightness difference between two adjacent display regions (any two adjacent regions of the first display region 100, the first sub-transition display region 201, the second sub-transition display region 202, and the second display region 300) is reduced, and the boundary between the first display region 100 and the second display region 300 is more effectively weakened, thereby improving the quality of display image, and enhancing the display effect.

Optionally, in the third pixel unit 210 in the first sub-transition display region 201, a ratio of a total opening area of the white sub-pixels 104 to an area of the third pixel unit 210 is C; and in the third pixel unit 210 in the second sub-transition display region 202, a ratio of a total opening area of the white sub-pixels 104 to an area of the third pixel unit is D, where C<D.

In this way, an opening ratio of the white sub-pixels 104 in the first sub-transition display region 201 and an opening ratio of the white sub-pixels 104 in the second sub-transition display region 202 sequentially increases, and an opening ratio of the color sub-pixels (the first sub-pixel 101, the second sub-pixel 102, and the third sub-pixel 103) in the first sub-transition display region 201 and an opening ratio of the color sub-pixels (the first sub-pixel 101, the second sub-pixel 102, and the third sub-pixel 103) in the second sub-transition display region 202 sequentially decreases. In one aspect, no apparent boundary exists in the displayed image when the color sub-pixels (the first sub-pixel 101, the second sub-pixel 102, and the third sub-pixel 103) are used in the display panel; and in the other aspect, when the white sub-pixel 104 is lit to supply light in the display stage, the total intensity of the supplementary light in the first sub-transition display region 201 and the total intensity of the supplementary light in the second sub-transition display region 202 is increased, thereby achieving the brightness transition from the first display region 100 to the second display region 200.

Figure 8:
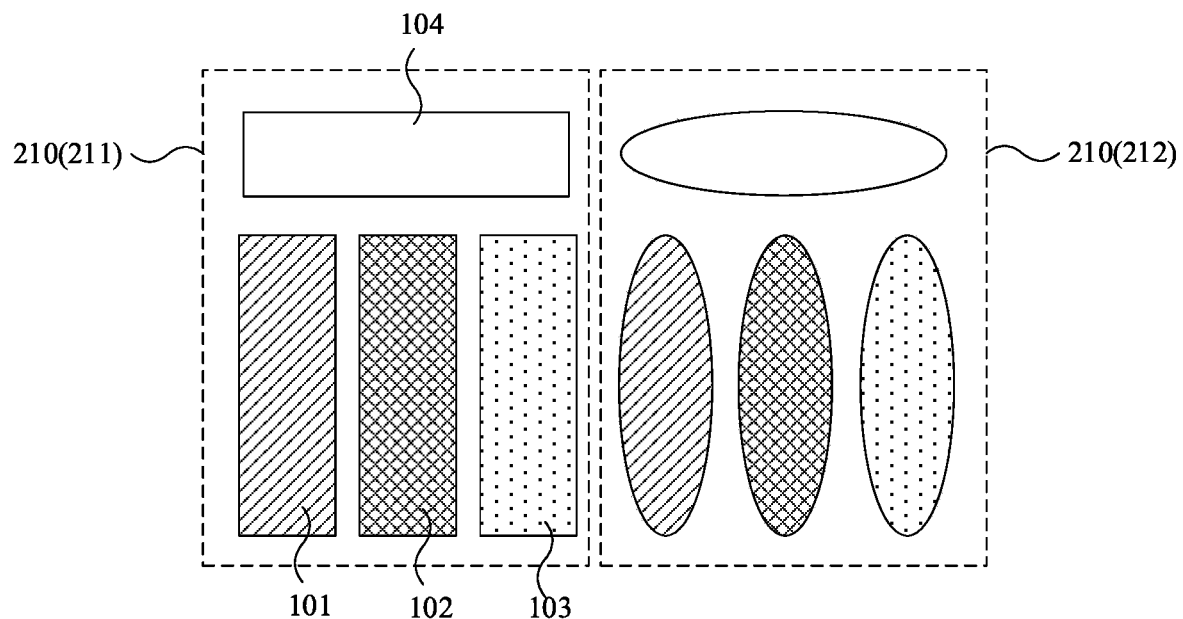
FIG. 8 is a structure diagram of two adjacent third pixel units arranged in a first sub-transition display region and a second sub-transition display region according to an embodiment of the present disclosure.

FIG. 8 is a structure diagram of two adjacent third pixel units in a first sub-transition display region and a second sub-transition display region according to an embodiment of the present disclosure. As shown in FIG. 8, two third pixel units 210 include a first sub-pixel unit 211 and a second sub-pixel unit 212, the first sub-pixel unit 211 is the third pixel unit 210 in the first sub-transition display region, and the second sub-pixel unit 212 is the third pixel unit 210 in the second sub-transition display region. In the third pixel unit 210 in the first sub-transition display region, the first sub-pixel 101, the second sub-pixel 102, the third sub-pixel 103, and the white sub-pixel 104 each have a second shape. In the third pixel unit 210 in the second sub-transition display region, the first sub-pixel 101, the second sub-pixel 102, the third sub-pixel 103, and the white sub-pixel 104 each have a third shape. The second shape is a rectangle, and the third shape is an oval.

Figure 9:
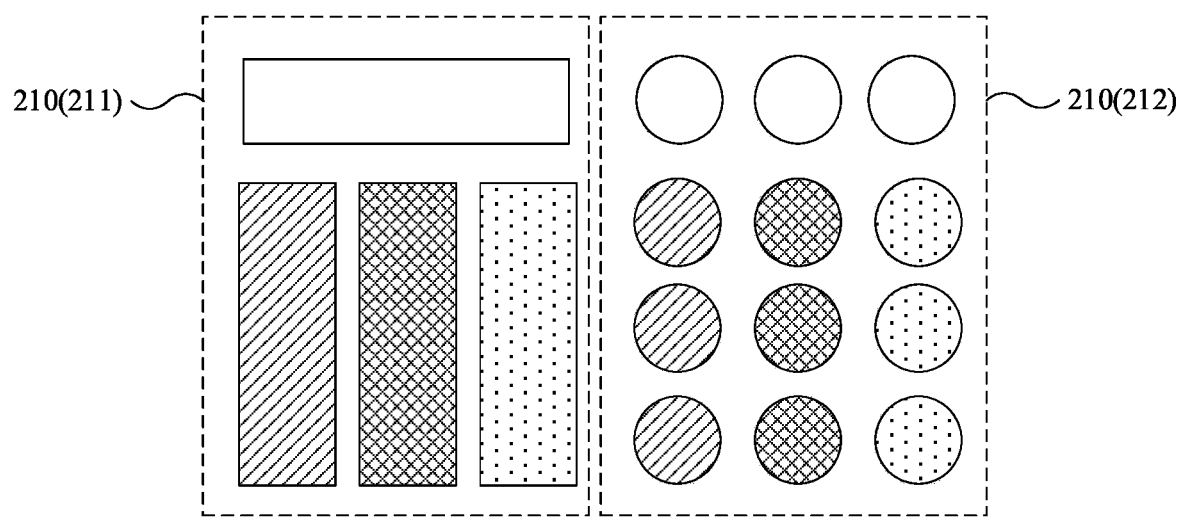
FIG. 9 is a structure diagram of two adjacent third pixel units arranged in a first sub-transition display region and a second sub-transition display region according to an embodiment of the present disclosure.
Figure 10:
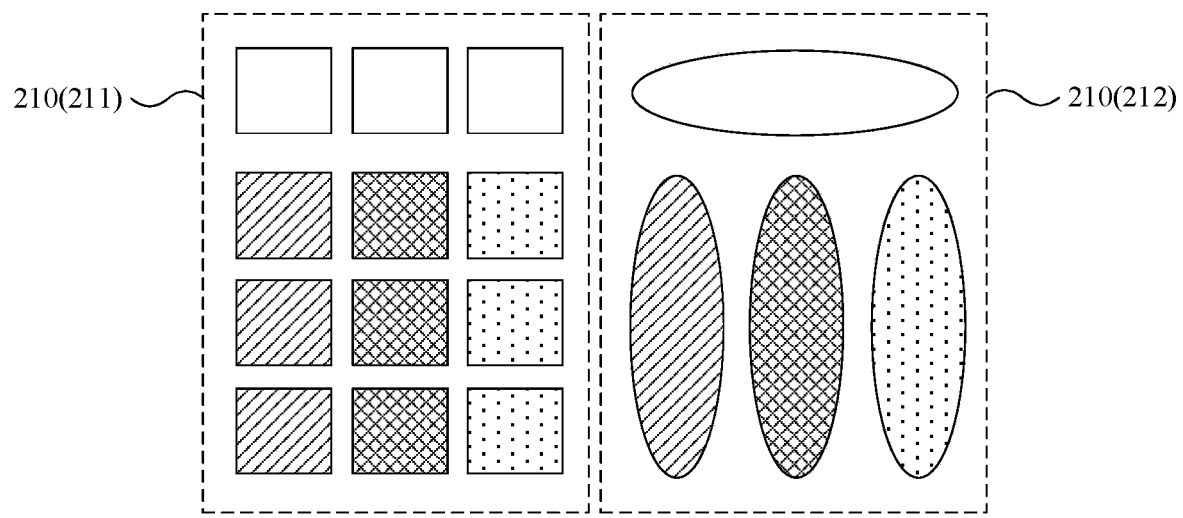
FIG. 10 is a structure diagram of two adjacent third pixel units in a first sub-transition display region and a second sub-transition display region according to an embodiment of the present disclosure.
Figure 11:
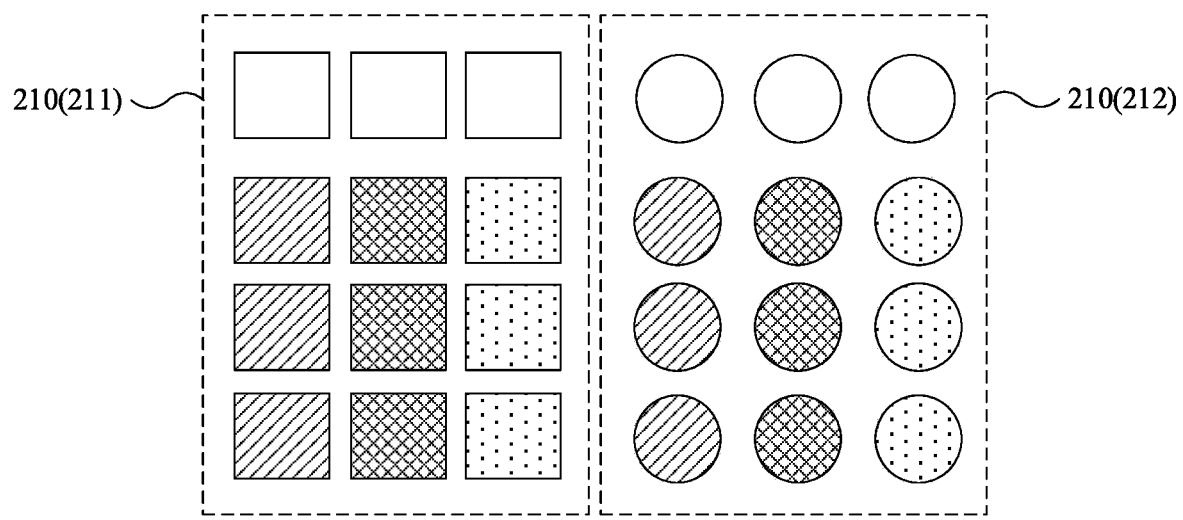
FIG. 11 is a structure diagram of two adjacent third pixel units in a first sub-transition display region and a second sub-transition display region according to an embodiment of the present disclosure.

In other implementation modes of this embodiment, the second shape and the third shape may further be in other combination modes. For example, as shown in FIG. 9, the second shape is a rectangle and the third shape is a circle; or as shown in FIG. 10, the second shape is a square and the third shape is an oval; or as shown in FIG. 11, the second shape is a square and the third shape is a circle.

It is to be noted that the shape of the sub-pixel in the first display region is typically a rectangle, the shape of the sub-pixel in the second display region is typically a circle, and in order to achieve the smooth transition from the first display region to the second display region, the shapes of the sub-pixels in the first display region, the transition display region and the second display region are gradually changed from a rectangle to a circle having an opening area similar to that of the rectangle. That is to say, the closer the sub-pixel in the transition display region is to the first display region, the closer the shape of the sub-pixel in the transition display region is to the rectangle; and the closer the sub-pixel in the transition display region is to the second display region, the closer the shape of the sub-pixel in the transition region is to the circle, thus achieving the gradual transition of the opening area of the sub-pixel. For example, the shapes of the sub-pixels may specifically be the shape combination mode of sub-pixels shown in FIG. 8 to FIG. 11.

It is to be understood that the combination of the second shape and the third shape is not limited to the three types provided in the above embodiments, and any shape capable of achieving the smooth transition of the opening ratios of the sub-pixels in the first display region, the transition display region, and the second display region is within the scope of this embodiment.

Figure 12:
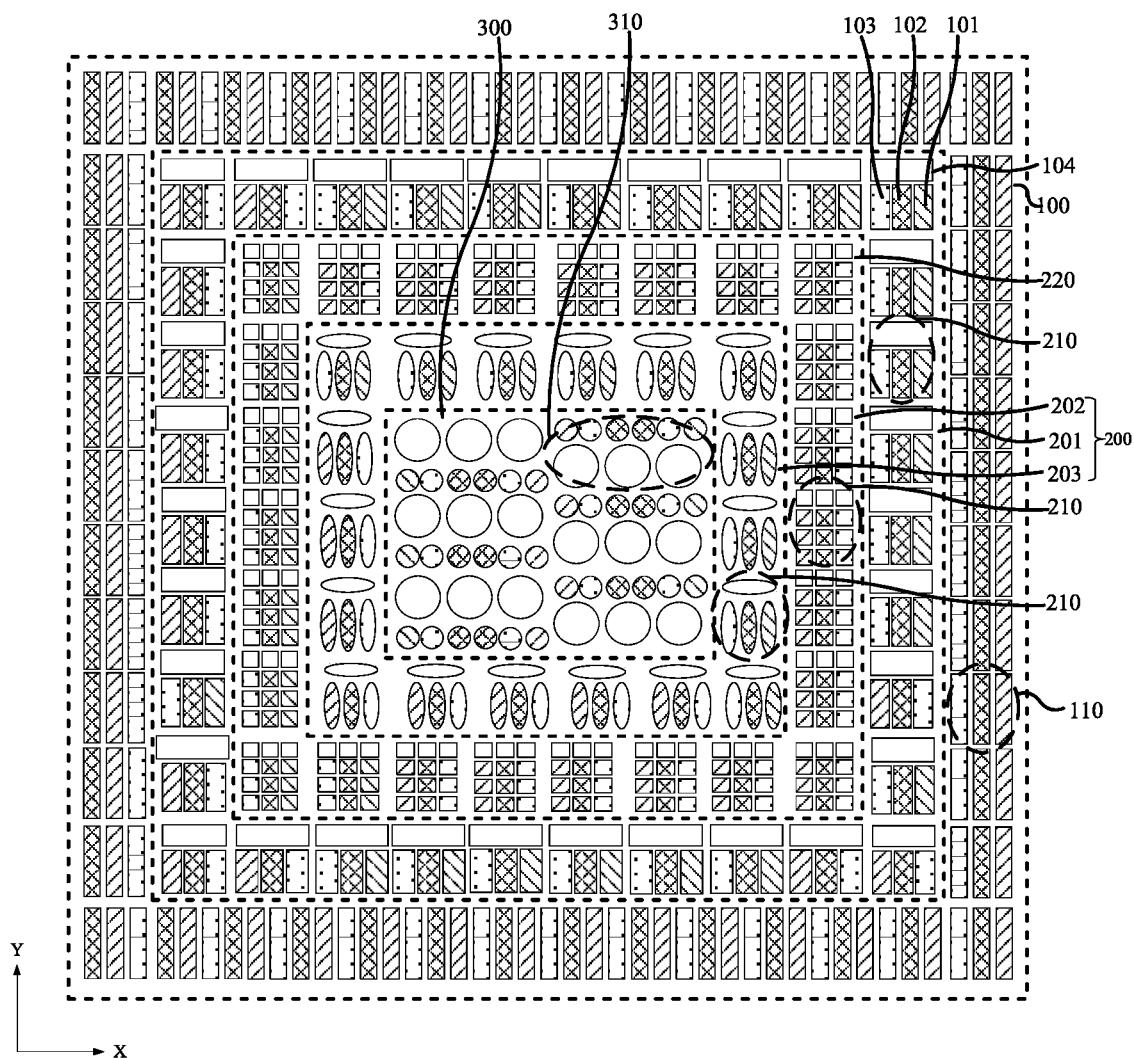
FIG. 12 is a partial structure view of another display panel according to an embodiment of the present disclosure.

FIG. 12 is a partial structure view of another display panel according to an embodiment of the present disclosure. As shown in FIG. 12, the transition display region 200 includes a first sub-transition display region 201, a second sub-transition display region 202, and a third sub-transition display region 203, and the third sub-transition display region 203 is disposed on one side of the second sub-transition display region 202 facing towards the second display region 300.

In this way, third-level transition may be formed in the transition display region 200, a gradient step is added, image fineness difference and brightness difference between two adjacent display regions (any two adjacent regions of the first display region 100, the first sub-transition display region 201, the second sub-transition display region 202, the third sub-transition display region 203 and the second display region 300) are reduced, and the boundary between the first display region 100 and the second display region 300 is more effectively weakened, thereby improving the quality of display image, and enhancing the display effect.

Optionally, in the third pixel unit 210 in the first sub-transition display region 210, the ratio of the total opening area of the white sub-pixels 104 to the area of the third pixel unit 210 is C; in the third pixel unit 210 in the second sub-transition display region 202, the ratio of the total opening area of the white sub-pixels 104 to the area of the third pixel unit 210 is D; and in a third pixel unit 210 in the third sub-transition display region 203, a ratio of a total opening area of the white sub-pixels 104 to an area of the third pixel unit 210 is E, where C<D<E.

In this way, an opening ratio of the white sub-pixels 104 in the first sub-transition display region 201, an opening ratio of the white sub-pixels 104 in the second sub-transition display region 202, and an opening ratio of the white sub-pixels 104 in the third sub-transition display region 203 sequentially increases, and an opening ratio of the color sub-pixels (the first sub-pixel 101, the second sub-pixel 102, and the third sub-pixel 103) in the first sub-transition display region 201, an opening ratio of the color sub-pixels (the first sub-pixel 101, the second sub-pixel 102, and the third sub-pixel 103) in the second sub-transition display region 202, and an opening ratio of the color sub-pixels (the first sub-pixel 101, the second sub-pixel 102, and the third sub-pixel 103) in the third sub-transition display region 203 sequentially decreases. In one aspect, no apparent boundary exists in the displayed image when the color sub-pixels (the first sub-pixel 101, the second sub-pixel 102, and the third sub-pixel 103) are used in the display panel; and in the other aspect, when the white sub-pixel 104 is lit to supply light in the display stage, the total intensities of the supplementary light in the first sub-transition display region 201, the second sub-transition display region 202 and the third sub-transition display region 203 are gradually increased, thereby achieving the brightness transition from the first display region 100 to the second display region 200.

Figure 13:
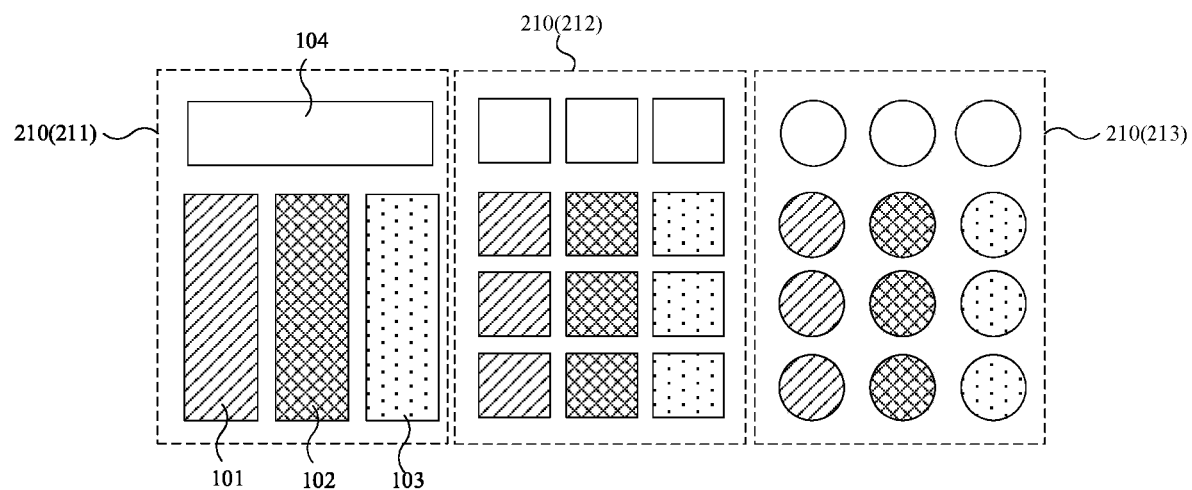
FIG. 13 is a structure diagram of three adjacent third pixel units in a first sub-transition display region, a second sub-transition display region and a third sub-transition display region according to an embodiment of the present disclosure.

FIG. 13 is a structure diagram of three adjacent third pixel units in a first sub-transition display region, a second sub-transition display region and a third sub-transition display region according to an embodiment of the present disclosure. It is to be noted that FIG. 13 only illustrates that only one pixel unit is disposed in the second sub-transition display region, and the illustration does not impose an absolute limitation on the number of pixel units in the second sub-transition display region in the product. In an embodiment, referring to FIG. 13, three third pixel units 210 include a first sub-pixel unit 211, a second sub-pixel unit 212 and a third sub-pixel unit 213. The first sub-pixel unit 211 is the third pixel unit 210 in the first sub-transition display region, the second sub-pixel unit 212 is the third pixel unit 210 in the second sub-transition display region, and the third sub-pixel unit 213 is the third pixel unit 210 in the third sub-transition display region.

As shown in FIG. 13, in the third pixel unit 210 in the first sub-transition display region, the first sub-pixel 101, the second sub-pixel 102, the third sub-pixel 103, and the white sub-pixel 104 each have a fourth shape; and in the third pixel unit 210 in the second sub-transition display region, the first sub-pixel 101, the second sub-pixel 102, the third sub-pixel 103, and the white sub-pixel 104 each have a fifth shape; and in the third pixel unit 210 in the third sub-transition display region, the first sub-pixel 101, the second sub-pixel 102, the third sub-pixel 103, and the white sub-pixel 104 each have a sixth shape. The fourth shape is a rectangle, the fifth shape is a square, and the sixth shape is a circle.

Figure 14:
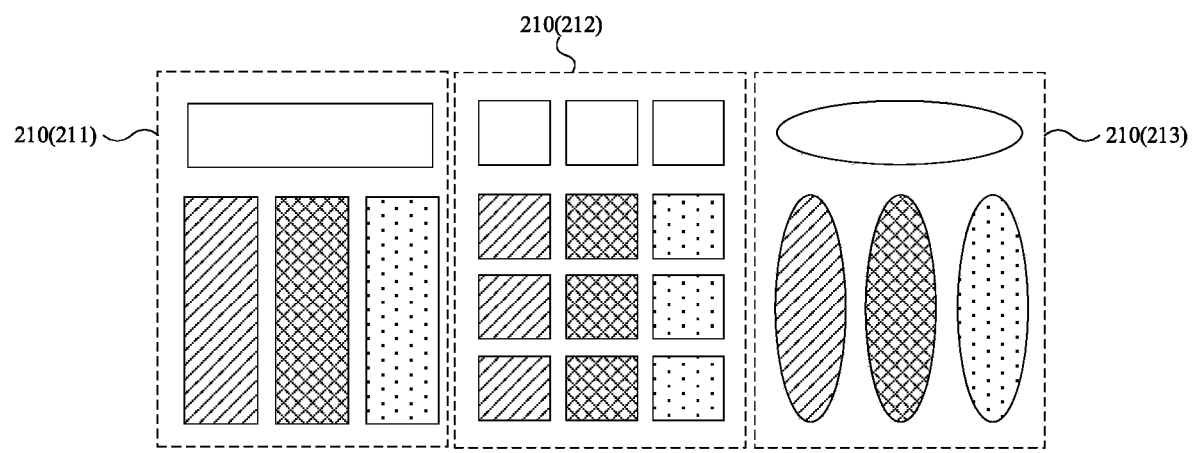
FIG. 14 is a structure diagram of three adjacent third pixel units in a first sub-transition display region, a second sub-transition display region and a third sub-transition display region according to an embodiment of the present disclosure.

Optionally, FIG. 14 is a structure diagram of three adjacent third pixel units in a first sub-transition display region, a second sub-transition display region and a third sub-transition display region according to an embodiment of the present disclosure. As shown in FIG. 14, the fourth shape is a rectangle, the fifth shape is a square, and the sixth shape is an oval.

It is to be noted that the shape of the sub-pixel in the first display region is typically a rectangle, the shape of the sub-pixel in the second display region is typically a circle, and in order to achieve the smooth transition from the first display region to the second display region, the shapes of the sub-pixels in the first display region, the transition display region and the second display region are gradually changed from a rectangle to a circle. That is to say, the closer the sub-pixel in the transition display region is to the first display region, the closer the shape of the sub-pixel in the sub-transition display region is to the rectangle; and the closer the sub-pixel in the transition display region is to the second display region, the closer the shape of the sub-pixel in the sub-transition display region is to the circle, thus achieving the gradual transition of the opening ratios of the sub-pixels in the first display region, the transition display region and the second display region. For example, the shapes of the sub-pixels may specifically be the shape combination mode of sub-pixels shown in FIG. 13 and FIG. 14.

It is to be noted that the combination of the fourth shape, the fifth shape and the sixth shape is not limited to the two types provided in the above embodiments, and any shape capable of achieving the smooth transition of the opening ratios of the sub-pixels in the first display region, the transition display region, and the second display region is within the scope of this embodiment.

Exemplarily, in the third pixel unit 210 in the first sub-transition display region, a ratio of the total opening area of the white sub-pixels 104 to a total opening area of the first sub-pixels 101 is F1, a ratio of the total opening area of the white sub-pixels 104 to a total opening area of the second sub-pixels 102 is F2, and a ratio of the total opening area of the white sub-pixels 104 to a total opening area of the third sub-pixels 103 is F3, where $½≤F1≤1$, $½≤F2≤1$, and $½≤F3≤1$.

In the third pixel unit 210 in the second sub-transition display region, a ratio of the total opening area of the white sub-pixels 104 to a total opening area of the first sub-pixels 101 is G1; a ratio of the total opening area of the white sub-pixels 104 to a total opening area of the second sub-pixels 102 is G2, and a ratio of the total opening area of the white sub-pixels 104 to a total opening area of the third sub-pixels 103 is G3, where $⅓≤G1≤1$, $⅓≤G2≤1$, and $⅓≤G3≤1$.

In the third pixel unit 210 in the third sub-transition display region, a ratio of the total opening area of the white sub-pixels 104 to a total opening area of the first sub-pixels 101 is H1; a ratio of the total opening area of the white sub-pixels 104 to a total opening area of the second sub-pixels 102 is H2, and a ratio of the total opening area of the white sub-pixels 104 to a total opening area of the third sub-pixels 103 is H3, where ¼≤H1≤1, ¼≤H2≤1, and ¼≤H3≤1.

In this way, a ratio of the opening area of the white sub-pixels 104 to the opening area of the color sub-pixels (the first color sub-pixel 101, the second color sub-pixel 102, and the third color sub-pixel 103) in the first sub-transition display region, a ratio of the opening area of the white sub-pixels 104 to the opening area of the color sub-pixels in the second sub-transition display region, and a ratio of the opening area of the white sub-pixels 104 to the opening area of the color sub-pixels in the third sub-transition display region sequentially increases. In addition, a ratio of the total opening area of the color sub-pixels (the first color sub-pixel 101, the second color sub-pixel 102, and the third color sub-pixel 103) to total opening area of the pixel unit in the first sub-transition display region, a ratio of the total opening area of the color sub-pixels to total opening area of the pixel unit in the second sub-transition display region, a ratio of the total opening area of the color sub-pixels to total opening area of the pixel unit in the third sub-transition display region sequentially decreases, and the fineness of the image displayed by the color sub-pixel (the first color sub-pixel 101, the second color sub-pixel 102, and the third color sub-pixel 103) in the first sub-transition display region, the fineness of the image displayed by the color sub-pixel in the second sub-transition display region, and the fineness of the image displayed by the color sub-pixel in the second sub-transition display region sequentially decreases. In so doing, the fineness of the display image is gradually transitioned from the first display region to the second display region and the boundary between the first display region and the second display region is effectively weakened, thereby facilitating the improvement of the display effect of the display image. In the other aspect, the ratio of the total opening area of the white sub-pixels 104 to the total opening area of the pixel unit sequentially increases, and when the white sub-pixel 104 is lit to supply light in the display stage, the total intensities of the supplementary light in the first sub-transition display region, the second sub-transition display region and the third sub-transition display region are sequentially increased, thereby achieving the brightness transition from the first display region to the second display region.

In this embodiment, a value range of a width ratio among the first sub-transition display region, the second sub-transition display region, and the third sub-transition display region may be greater than 1:1:1 and less than or equal to 3:2:1.

It is to be noted that a distance between the first sub-transition display region and the first display region, a distance between the second sub-transition display region and the first display region, a distance between the third sub-transition display region and the first display region sequentially increase; and the ratio of the opening area of the white sub-pixels 104 to the total opening area of the pixel unit in the first sub-transition display region, the ratio of the opening area of the white sub-pixels 104 to the total opening area of the pixel unit in the second sub-transition display region, and the ratio of the opening area of the white sub-pixels 104 to the total opening area of the pixel unit in the third sub-transition display region sequentially increase, and the display difference between the transition display region and the first display region serving as the normal display region increases from the first display region, the first sub-transition display region, the second sub-transition display region to the third sub-transition display region. A width of the first sub-transition display region, a width of the second sub-transition display region, and a width of the third sub-transition display region are sequentially decreased so as to reduce the display difference between the whole transition display region and the normal display region, thereby improving the display effect of the display image.

Exemplarily, a ratio of a number of third pixel units 210 among the first sub-transition display region, the second sub-transition display region, and the third sub-transition display region is greater than 1:1:1 and less than or equal to 3:2:1.

In this way, it is convenient to set that the total opening areas of the white sub-pixels 104 in the first sub-transition display region, the second sub-transition display region, and the third sub-transition display region are sequentially increased, and thus when the white sub-pixel 104 is used to supply light in the display stage, the total intensities of the supplementary light in the first sub-transition display region, the second sub-transition display region and the third sub-transition display region are sequentially increased, the gradual transition of brightness from the first display region to the second display region is achieved, and the boundary between the first display region and the second display region is weakened, thereby improving the display effect of the display panel.

Optionally, a total area of white sub-pixels 104 in the first sub-transition display region is I, a total area of white sub-pixels 104 in the second sub-transition display region is J, and a total area of white sub-pixels 104 in the third sub-transition display region is L, where I<J<L.

It is to be noted that the opening ratios of the color sub-pixels (the first sub-pixel 101, the second sub-pixel 102, and the third sub-pixel 103) gradually decreases from the first sub-transition display region to the third sub-transition display region, and in the display stage, the brightness of the image is also gradually dimmed from the first sub-transition display region to the third sub-transition display region. The total areas of the white sub-pixels 104 are gradually increased from the first sub-transition display region to the third sub-transition display region, such that the brightness of the supplementary light can be gradually increased, and the problem that the brightness of the display image is not uniform caused by the reduction of the opening ratio of the color sub-pixels (the first sub-pixel 101, the second sub-pixel 102, and the third sub-pixel 103) can be reduced.

Optionally, a ratio of a width of the transition display region to a width of the second display region may be less than or equal to ⅕.

It is to be noted that when the ratio of the width of the transition display region to the width of the second display region is greater than ⅕, the width of the transition display region is too large, which reduces an overall resolution of the display panel, thus affecting the fineness of the display image, and reducing the image display quality of the display panel; and when the ratio of the width of the transition display region to the width of the second display region is less than or equal to ⅕, the width of the transition display region is appropriate, thus ensuring that the display image has higher fineness, and improving the image display quality of the display panel.

Exemplarily, a value range of the width K of the transition display region may be: 180≤K≤540 μm.

It is to be noted that a too-small width of the transition display region results in a poor transition effect, and the apparent boundary between the first display region and the second display region cannot be effectively eliminated; and a too-large width of the transition display region results in a larger occupied area, and the overall resolution of the display panel is reduced, thereby affecting the fineness of the display image. When the width of the transition display region is between 180 μm and 540 μm, the width of the transition display region is appropriate, so that the transition display region can achieve the function of transition of brightness and fitness that can be recognizable by human eyes, and the apparent boundary between the first display region and the second display region is eliminated, thereby ensuring that the display image has higher fineness on the basis of effectively eliminating the apparent boundary between the first display region and the second display region.

Optionally, a value range of the pixel density O of the first display region may be 350≤O≤450, a value range of a pixel density P of the transition display region may be 300≤P≤330, and a value range of the pixel density Q of the second display region may be 200≤Q≤250.

In this way, the display panel has a fine display effect, an appropriate sub-pixel size, and low processing difficulty. In addition, the pixel density of the first display region, the pixel density of the transition display region and the pixel density of the second display region are sequentially decreased, so that the apparent boundary between the first display region and the second display region in the display image is avoided, thereby facilitating the improvement of the display effect of the display panel. The difference of pixels density between two adjacent display regions is about 50 to make the opening ratios of sub-pixels of the two adjacent display regions to be smoothly transitioned, such that the apparent boundary is difficult to be recognized by human eyes.

Still referring to FIG. 12, the first display region 100 includes a plurality of first pixel units 110, each of the plurality of first pixel units 110 includes a first sub-pixel 101, a second sub-pixel 102, and a third sub-pixel 103, and the first sub-pixel 101, the second sub-pixel 102, and the third sub-pixel 103 are sequentially arranged in a first direction X. In the each of the plurality of third pixel units 210, the first sub-pixel 101, the second sub-pixel 102, and the third sub-pixel 103 are sequentially arranged in the first direction X; the white sub-pixel 104 is disposed on either one side of the first sub-pixel 101, the second sub-pixel 102, and the third sub-pixel 103 in a second direction Y; and the second direction Y is perpendicular to the first direction X.

For example, in FIG. 12, the first direction X is a horizontal direction, and the second direction Y is a vertical direction, the first sub-pixel 101, the second sub-pixel 102, and the third sub-pixel 103 in the third pixel unit 210 are arranged as the sub-pixel row in the horizontal direction, and the white sub-pixel 104 in the same third pixel unit is disposed on an upper side of the sub-pixel row, that is, in all the third pixel units 210, the white sub-pixel 104 is disposed on the same side of the sub-pixel row.

In this way, when the transition display region includes a plurality of sub-transition display regions sequentially arranged between the first display region and the second display region, all the third pixel units 210 in the same sub-transition display region have the same structure, and only one structure of the third pixel unit 210 needs to be designed, thereby facilitating the reduction of the design difficulty of the display panel.

Figure 15:
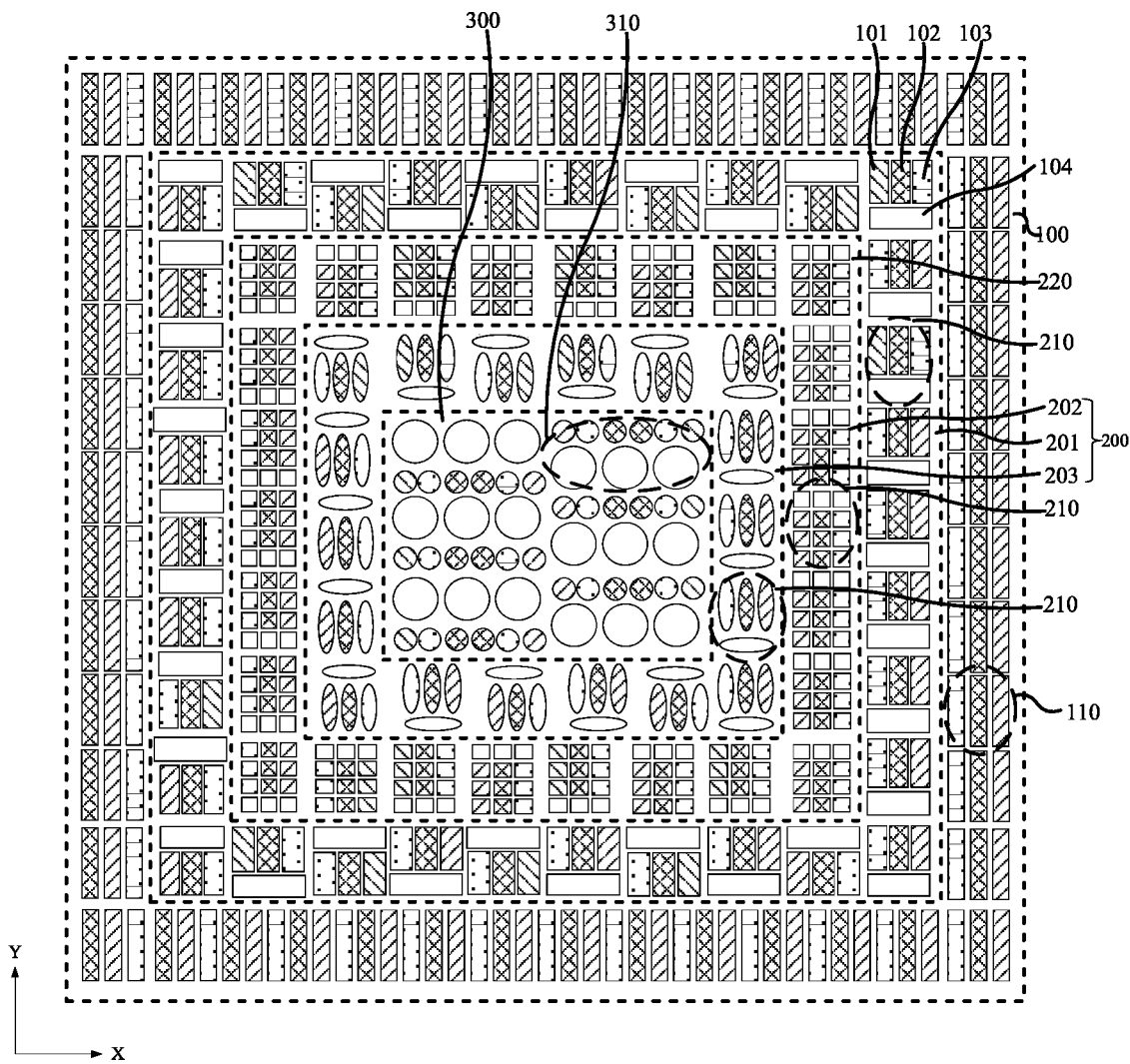
FIG. 15 is a partial structure view of another display panel according to an embodiment of the present disclosure.

Optionally, FIG. 15 is a partial structure diagram of another display panel according to an embodiment of the present disclosure. As shown in FIG. 15, in two adjacent third pixel units 210 in the transition display region 200 in the first direction X, white sub-pixels 104 are disposed on different sides of the first sub-pixel 101, the second sub-pixel 102 and the third sub-pixel 103 in the second direction Y. In two adjacent third pixel units 210 in the transition display region 200 in the second direction Y, white sub-pixels 104 are disposed on the same side of the first sub-pixel 101, the second sub-pixel 102 and the third sub-pixel 103 in the second direction Y.

For example, in FIG. 15, the first direction X is the horizontal direction, the second direction Y is the vertical direction, the first sub-pixel 101, the second sub-pixel 102, and the third sub-pixel 103 in the third pixel unit 210 are arranged as the sub-pixel row in the horizontal direction. In any two adjacent third pixel units 210 in the horizontal direction, the white sub-pixel 104 in one of the two third pixel units 210 is disposed on the upper side of the sub-pixel row, and the white sub-pixel 104 in another one of the two third pixel units 210 is disposed on a lower side of the sub-pixel row, that is, in any two adjacent third pixel units 210 in the horizontal direction, the white sub-pixels 104 are disposed on different sides of the sub-pixel row.

In this way, the white sub-pixels 104 in the transition display region 200 are distributed more evenly, so that when the white sub-pixels 104 are lit for light supplement in the display stage, the light supplement in the transition display region 200 is more uniform and the effect of light supplement is better. In addition, the above configuration can further reduce the diffraction phenomenon and solve the problem of displaying dark lines in a stage when the white sub-pixel 104 is not turned on.

Figure 16:
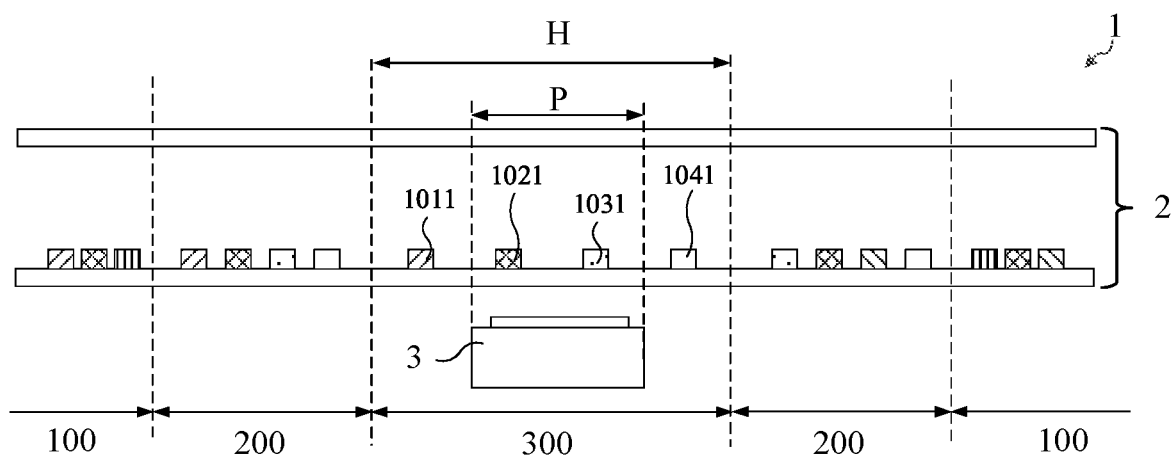
FIG. 16 is a structure diagram of a display device according to an embodiment of the present disclosure.

FIG. 16 is a structure diagram of a display device according to an embodiment of the present disclosure. As shown in FIG. 16, the display device 1 includes the display panel 2 provided by any embodiment of the present disclosure and an optical electronic component 3 disposed in a second display region 300. Since the display device 1 provided by this embodiment of the present disclosure includes the display panel 2 provided by any embodiment of the present disclosure, the display device has the same or corresponding beneficial effects as the display panel 2 included therein, and details are not described here again.

It is to be noted that since the second display region 300, the first display region 100, and the transition display region 200 can all be used for display, the display device 1 can perform full-screen display on a display surface facing towards the user side, thereby obtaining a full-screen display device.

Exemplarily, the optical electronic component 3 may include one or more of a camera module, a photosensitive sensor and an ultrasonic distance sensor.

For example, the display device 1 is a mobile phone or a tablet computer. When the optical electronic component 3 is an camera module, the second display region 300 corresponds to a region where a front camera of the mobile phone or the tablet computer is located, and the front camera receives external light through the white sub-pixel 104 (light transmitting region) within the second display region 300. When the optical electronic component 3 is a photosensitive sensor, the photosensitive sensor may be a photosensitive sensor configured to sense external light to adjust the brightness of the display device 1, or a photosensitive sensor configured to sense whether a fingerprint exists in the outside of the display device so as perform fingerprint identification. The photosensitive sensor receives external light through the white sub-pixels 104 (light transmitting region) in the second display region 300, and then performs sensing.

Optionally, the second display region 300 and a part of a transition display region 200 fall within a viewing region of the optical electronic component 3, and a value range of a width of the part of the transition display region 200 falling within the viewing region of the optical electronic component 3 is less than or equal to 15 μm.

The viewing region of the optical electronic component 3 is a range that can be recognized by the optical electronic component. For example, when the optical electronic component 3 is a camera, the viewing region of the optical electronic component 3 is a range that can be photographed by the camera.

It is to be noted that the opening ratio of the white sub-pixels 104 in the transition display region 200 is less than the aperture ratio of the white sub-pixels 104 in the second display region 300, the optical electronic element 3 obtains light through the opening region of the white sub-pixel 104 The value range of the width of the transition display region 200 falling within the viewing region of the optical electronic element 3 is less than or equal to 150 μm, so that the normal working of the optical electronic element 3 can be prevented from being affected by the relatively low light transmittance of the transition display region 200.

Referring to FIG. 16, a value range of a difference between a width H of the second display region 300 and a width P of the optical electronic component 3 may be 100 μm to 200 μm.

In this way, in a process of assembling the display device 1, the optical electronic component 3 can be accurately installed in the second display region 300 even if an assembly error exists, so that each region of the optical electronic component 3 can receive sufficient external light through the white sub-pixels 104 (light transmitting region) in the second display region 300 so as to work normally.

Still referring to FIG. 16, the display panel 2 includes a plurality of first organic light emitting elements 1011, a plurality of second organic light emitting elements 1021, a plurality of third organic light emitting elements 1031, and a plurality of white organic light emitting elements 1041. A first sub-pixel includes a first organic light emitting element 1011, a second sub-pixel includes a second organic light emitting element 1021, a third sub-pixel includes a third organic light emitting element 1031, and a white sub-pixel includes a white organic light emitting element 1041.

In this case, the display device 1 is an organic light emitting display device and has the advantages of self-luminous without backlight, high brightness, low power consumption and the like. In addition, the sub-pixels of the display device 1 emit light through the light emitting elements, and the light emitting elements of different sub-pixels are independent to each other, thus facilitating the formation of the light transmitting region between the light emitting elements, and thus the second display region 300 having the functions of display and light transmitting is formed, thereby ensuring the functions of the optical electronic elements 3 to be normally achieved, and achieving the full-screen display.

Figure 17:
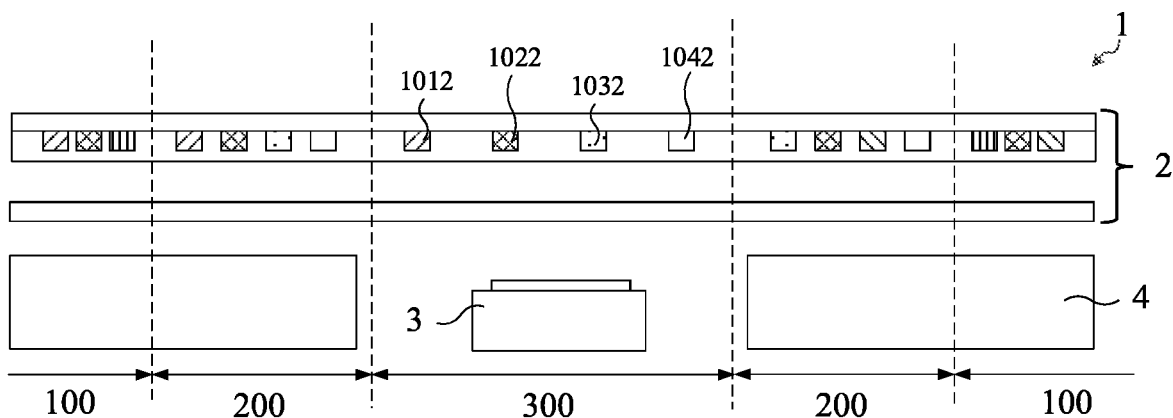
FIG. 17 is a structure diagram of another display device according to an embodiment of the present disclosure.

FIG. 17 is a structure view of another display device according to an embodiment of the present disclosure. As shown in FIG. 17, the display device further includes a backlight module, and the display panel 2 is disposed at a light emitting side of the backlight module 4. The display panel 2 includes an array substrate 21 and a color filter substrate 22 disposed on one side of the array substrate 21 facing away from the backlight module 4. The color filter substrate 22 includes a plurality of first color filter layers 1012, a plurality of second color filter layers 1022, a plurality of third color filter layers 1032, and a plurality of transparent light transmitting layers 1042. A first sub-pixel includes a first color filter layer 1012, a second sub-pixel includes a second color filter layer 1022, a third sub-pixel includes a third color filter layer 1032, and a white sub-pixel includes a transparent light transmitting layer 1042.

In this case, the display device 1 is a liquid crystal display device, is provided with an optical electronic component disposed below the display panel, and further has the function of full-screen display, and the display device has the advantages of mature preparation process and stable product performance.

It is to be noted that the above are merely preferred embodiments of the present disclosure and the technical principles used therein. It is to be understood by those skilled in the art that the present disclosure is not limited to the specific embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. A display panel, comprising:
a first display region,
a transition display region, and
a second display region, wherein the transition display region is disposed between the first display region and the second display region, and a pixel density of the second display region is less than a pixel density of the first display region;
wherein the second display region comprises a plurality of second pixel units, the transition display region comprises a plurality of third pixel units, and each of the plurality of second pixel units and each of the plurality of third pixel units both comprise a first sub-pixel, a second sub-pixel, a third sub-pixel, and a white sub-pixel;
wherein a ratio of a total opening area of white sub-pixels in the plurality of second pixel units to a total area of the plurality of second pixel units is A, and a ratio of a total opening area of white sub-pixels in the plurality of third pixel units to a total area of the plurality of third pixel units is B, wherein B<A; and
wherein the white sub-pixel is configured to be turned on or off in a display stage of the display panel.

2. The display panel of claim 1, wherein the transition display region comprises a first sub-transition display region; and a first sub-pixel, a second sub-pixel, a third sub-pixel, and a white sub-pixel in a third pixel unit in the first sub-transition display region each have a first shape, and the first shape is a rectangle, a square, a circle, or an oval.

3. The display panel of claim 2, wherein the transition display region further comprises a second sub-transition display region, and the second sub-transition display region is disposed on one side of the first sub-transition display region facing towards the second display region; a ratio of a total opening area of white sub-pixels in third pixel units in the first sub-transition display region to an area of the third pixel units in the first sub-transition display region is C; and a ratio of a total opening area of white sub-pixels in third pixel units in the second sub-transition display region to an area of the third pixel units in the second sub-transition display region is D, wherein C<D.

4. The display panel of claim 3, wherein the first sub-pixel, the second sub-pixel, the third sub-pixel, and the white sub-pixel in the third pixel unit in the first sub-transition display region each have a second shape; and a first sub-pixel, a second sub-pixel, a third sub-pixel, and a white sub-pixel in a third pixel unit in the second sub-transition display region each have a third shape; and the second shape is a rectangle or a square, and the third shape is a circle or an oval.

5. The display panel of claim 3, wherein the transition display region further comprises a third sub-transition display region, and the third sub-transition display region is disposed on one side of the second sub-transition display region facing towards the second display region; the ratio of the total opening area of the white sub-pixels in the third pixel units in the first sub-transition display region to the area of the third pixel units in the sub-transition display region is C; the ratio of the total opening area of the white sub-pixels in the third pixel units in the second sub-transition display region to the area of the third pixel units in the second sub-transition display region is D; and in a third pixel unit in the third sub-transition display region, a ratio of a total opening area of white sub-pixels in third pixel units in third sub-transition display region to an area of the third pixel units in the third sub-transition display region is E, wherein C<D<E.

6. The display panel of claim 5, wherein the first sub-pixel, the second sub-pixel, the third sub-pixel, and the white sub-pixel in the third pixel unit in the first sub-transition display region each have a fourth shape; and a first sub-pixel, a second sub-pixel, a third sub-pixel, and a white sub-pixel in a third pixel unit in the second sub-transition display region each have a fifth shape; and a first sub-pixel, a second sub-pixel, a third sub-pixel, and a white sub-pixel in a third pixel unit in the third sub-transition display region each have a sixth shape; and the fourth shape is a rectangle, the fifth shape is a square, and the sixth shape is a circle or an oval.

7. The display panel of claim 5, wherein a ratio of the total opening area of the white sub-pixels in the third pixel units in the first sub-transition display region to a total opening area of first sub-pixels in the third pixel units in the first sub-transition display region is F1, a ratio of the total opening area of the white sub-pixels in the third pixel units in the first sub-transition display region to a total opening area of second sub-pixels in the third pixel units in the first sub-transition display region is F2, and a ratio of the total opening area of the white sub-pixels in the third pixel units in the first sub-transition display region to a total opening area of third sub-pixels in the third pixel units in the first sub-transition display region is F3, wherein $\frac{1}{2} \leq F1 \leq 1$, $\frac{1}{2} \leq F2 \leq 1$, and $\frac{1}{2} \leq F3 \leq 1$;

a ratio of the total opening area of the white sub-pixels in the third pixel units in the second sub-transition display region to a total opening area of first sub-pixels in the third pixel units in the second sub-transition display region is G1; a ratio of the total opening area of the white sub-pixels in the third pixel units in the second sub-transition display region to a total opening area of second sub-pixels in the third pixel units in the second sub-transition display region is G2, and a ratio of the total opening area of the white sub-pixels in the third pixel units in the second sub-transition display region to a total opening area of third sub-pixels in the third pixel units in the second sub-transition display region is G3, wherein $\frac{1}{3} \leq G1 \leq 1$, $\frac{1}{3} \leq G2 \leq 1$, and $\frac{1}{3} \leq G3 \leq 1$; and a ratio of the total opening area of the white sub-pixel in the third pixel units in the third sub-transition display region to a total opening area of first sub-pixels in the third pixel units in the third sub-transition display region is H1; a ratio of the total opening area of the white sub-pixels in the third pixel units in the third sub-transition display region to a total opening area of second sub-pixels in the third pixel units in the third sub-transition display region is H2, and a ratio of the total opening area of the white sub-pixels in the third pixel units in the third sub-transition display region to a total opening area of third sub-pixels in the third pixel units in the third sub-transition display region is H3, wherein $\frac{1}{4} \leq H1 \leq 1$, $\frac{1}{4} \leq H2 \leq 1$, and $\frac{1}{4} \leq H3 \leq 1$.

8. The display panel of claim 5, wherein a value range of a width ratio among the first sub-transition display region, the second sub-transition display region, and the third sub-transition display region is greater than 1:1:1 and less than or equal to 3:2:1.

9. The display panel of claim 5, wherein a ratio of a number of third pixel units among the first sub-transition display region, the second sub-transition display region, and the third sub-transition display region is greater than 1:1:1 and less than or equal to 3:2:1.

10. The display panel of claim 5, wherein a total area of white sub-pixels in the first sub-transition display region is I, a total area of white sub-pixels in the second sub-transition display region is J, and a total area of white sub-pixels in the third sub-transition display region is L, wherein I<J<L.

11. The display panel of claim 1, wherein a ratio of a width of the transition display region to a width of the second display region has a value range of less than or equal to $\frac{1}{5}$.

12. The display panel of claim 1, wherein a value range of a width K of the transition display region is $180 \leq K \leq 540$ μm.

13. The display panel of claim 1, wherein a value range of the pixel density O of the first display region is $350 \leq O \leq 450$, a value range of a pixel density P of the transition display region is $300 \leq P \leq 330$, and a value range of the pixel density Q of the second display region is $200 \leq Q \leq 250$.

14. The display panel of claim 1, wherein the first display region comprises a plurality of first pixel units, each of the plurality of first pixel units comprises a first sub-pixel, a second sub-pixel, and a third sub-pixel, and the first sub-pixel, the second sub-pixel, and the third sub-pixel of the each of the plurality of first pixel units are sequentially arranged in a first direction; and the first sub-pixel, the second sub-pixel, and the third sub-pixel in the each of the plurality of third pixel units are sequentially arranged in the first direction; the white sub-pixel is disposed on either side of the first sub-pixel, the second sub-pixel, and the third sub-pixel in the each of the plurality of third pixel units in a second direction; and the second direction is perpendicular to the first direction.

15. The display panel of claim 14, wherein in two adjacent pixel units in the transition display region in the first direction, white sub-pixels are disposed on different sides of first sub-pixels, second sub-pixels and third sub-pixels in the second direction; and in two adjacent pixel units in the transition display region in the second direction, white sub-pixels are disposed on a same side of first sub-pixels, second sub-pixels and third sub-pixels in the second direction.

16. A display device, comprising
a display panel, and
an optical electronic component disposed in a second display region,
wherein the display panel comprises: a first display region, a transition display region, and a second display region,
wherein the transition display region is disposed between the first display region and the second display region, and a pixel density of the second display region is less than a pixel density of the first display region;
wherein the second display region comprises a plurality of second pixel units, the transition display region comprises a plurality of third pixel units, and each of the plurality of second pixel units and each of the plurality of third pixel units both comprise a first sub-pixel, a second sub-pixel, a third sub-pixel, and a white sub-pixel;
wherein a ratio of a total opening area of white sub-pixels in the plurality of second pixel units to a total area of the plurality of second pixel units is A, and a ratio of a total opening area of white sub-pixels in the plurality of third pixel units to a total area of the plurality of third pixel units is B, wherein B<A; and
wherein the white sub-pixel is configured to be turned on or off in a display stage of the display panel.

17. The display device of claim 16, wherein a value range of a difference between a width of the second display region and a width of the optical electronic component is 100 μm to 200 μm.

18. The display device of claim 16, wherein the second display region and a part of the transition display region fall within a viewing region of the optical electronic component, and a value range of a width of the part of the transition display region falling within the viewing region of the optical electronic component is less than or equal to 15 μm.

19. The display device of claim 16, wherein the first sub-pixel comprises a first organic light emitting element, the second sub-pixel comprises a second organic light emitting element, the third sub-pixel comprises a third organic light emitting element, and the white sub-pixel comprises a white organic light emitting element.

20. The display device of claim 16, further comprising a backlight module, wherein the display panel is disposed at a light emitting side of the backlight module; and the display panel comprises an array substrate and a color filter substrate disposed on one side of the array substrate facing away from the backlight module, and the color filter substrate comprises a plurality of first color filter layers, a plurality of second color filter layers, a plurality of third color filter layers, and a plurality of transparent light transmitting layers; and
the first sub-pixel comprises the first color filter layer, the second sub-pixel comprises the second color filter layer, the third sub-pixel comprises the third color filter layer, and the white sub-pixel comprises the transparent light transmitting layer.

* * * * *